United States Patent
Azumo et al.

(10) Patent No.: US 11,788,185 B2
(45) Date of Patent: Oct. 17, 2023

(54) FILM FORMATION METHOD AND FILM FORMATION DEVICE

(71) Applicant: Tokyo Electron Limited, Tokyo (JP)

(72) Inventors: Shuji Azumo, Nirasaki (JP); Shinichi Ike, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/593,074

(22) PCT Filed: Mar. 3, 2020

(86) PCT No.: PCT/JP2020/008869
§ 371 (c)(1),
(2) Date: Sep. 8, 2021

(87) PCT Pub. No.: WO2020/184284
PCT Pub. Date: Sep. 17, 2020

(65) Prior Publication Data
US 2022/0186362 A1     Jun. 16, 2022

(30) Foreign Application Priority Data
Mar. 13, 2019    (JP) .................................. 2019-046325

(51) Int. Cl.
*C23C 16/02*      (2006.01)
*C23C 16/04*      (2006.01)
(Continued)

(52) U.S. Cl.
CPC .......... *C23C 16/0281* (2013.01); *C23C 16/04* (2013.01); *C23C 16/448* (2013.01);
(Continued)

(58) Field of Classification Search
None
See application file for complete search history.

(56) References Cited

U.S. PATENT DOCUMENTS

| 2006/0060562 | A1 | 3/2006 | Furukawa et al. |
| 2015/0155179 | A1* | 6/2015 | Jans ................. H01L 21/32051 257/618 |
| 2017/0342553 | A1 | 11/2017 | Yu et al. |

FOREIGN PATENT DOCUMENTS

| EP | 2881977 A2 * | 6/2015 | ......... B81C 1/00206 |
| EP | 2881977 A2 | 6/2015 | |

(Continued)

*Primary Examiner* — David P Turocy
(74) *Attorney, Agent, or Firm* — Armstrong Teasdale LLP

(57) ABSTRACT

A film formation method includes: providing a substrate including a first region in which a first material is exposed and a second region in which a second material different from the first material is exposed; forming an intermediate film selectively in the second region from the first region and the second region by supplying a processing gas to the substrate; forming a self-assembled monolayer in the first region and the second region after forming the intermediate film; removing the intermediate film and the self-assembled monolayer from the second region by heating the substrate to sublimate the intermediate film; and forming, after sublimation of the intermediate film, a target film selectively in the second region from the first region and the second region in a state in which the self-assembled monolayer is left in the first region.

5 Claims, 9 Drawing Sheets

(51) Int. Cl.
 *C23C 16/448* (2006.01)
 *C23C 16/458* (2006.01)
 *C23C 16/46* (2006.01)
 *C23C 16/52* (2006.01)

(52) U.S. Cl.
 CPC .......... *C23C 16/458* (2013.01); *C23C 16/46* (2013.01); *C23C 16/52* (2013.01)

(56) References Cited

FOREIGN PATENT DOCUMENTS

| | | | |
|---|---|---|---|
| JP | H11-097434 A | 4/1999 | |
| JP | 2007-501902 A | 2/2007 | |
| JP | 2017-222928 A | 12/2017 | |
| JP | 2018-059182 A | 4/2018 | |
| WO | WO-03050854 A2 * | 6/2003 | .......... B01J 19/0093 |

* cited by examiner

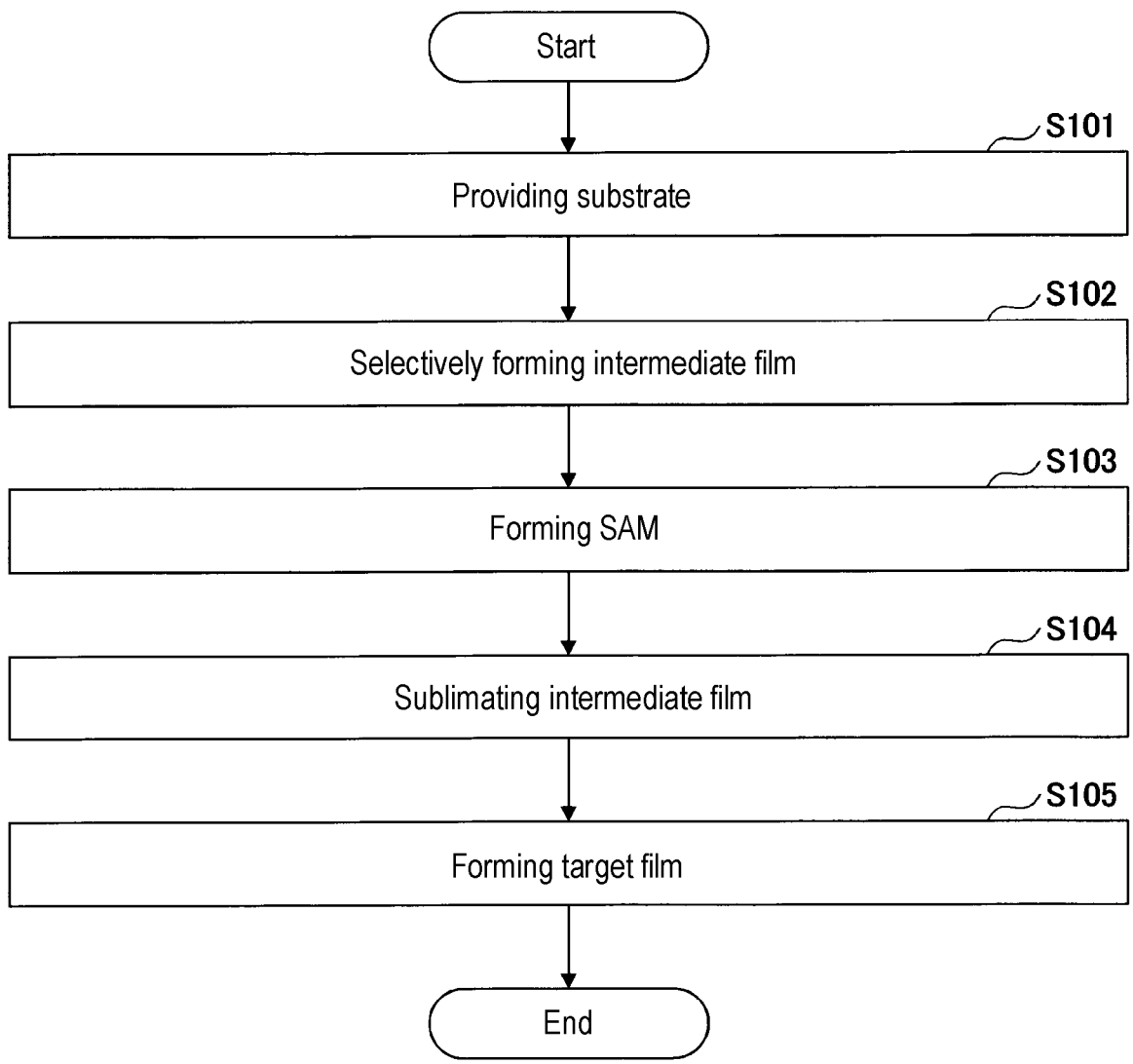

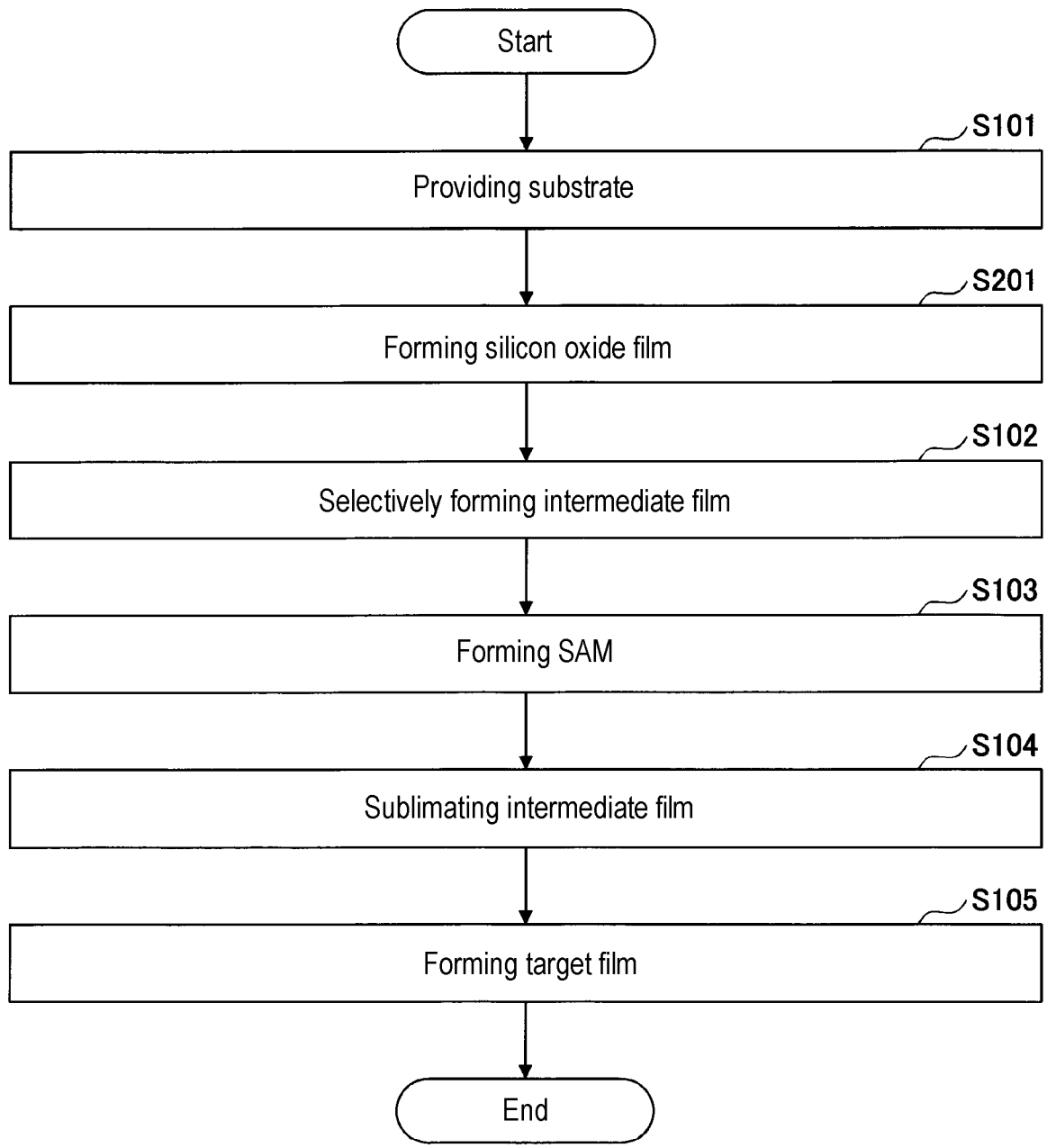

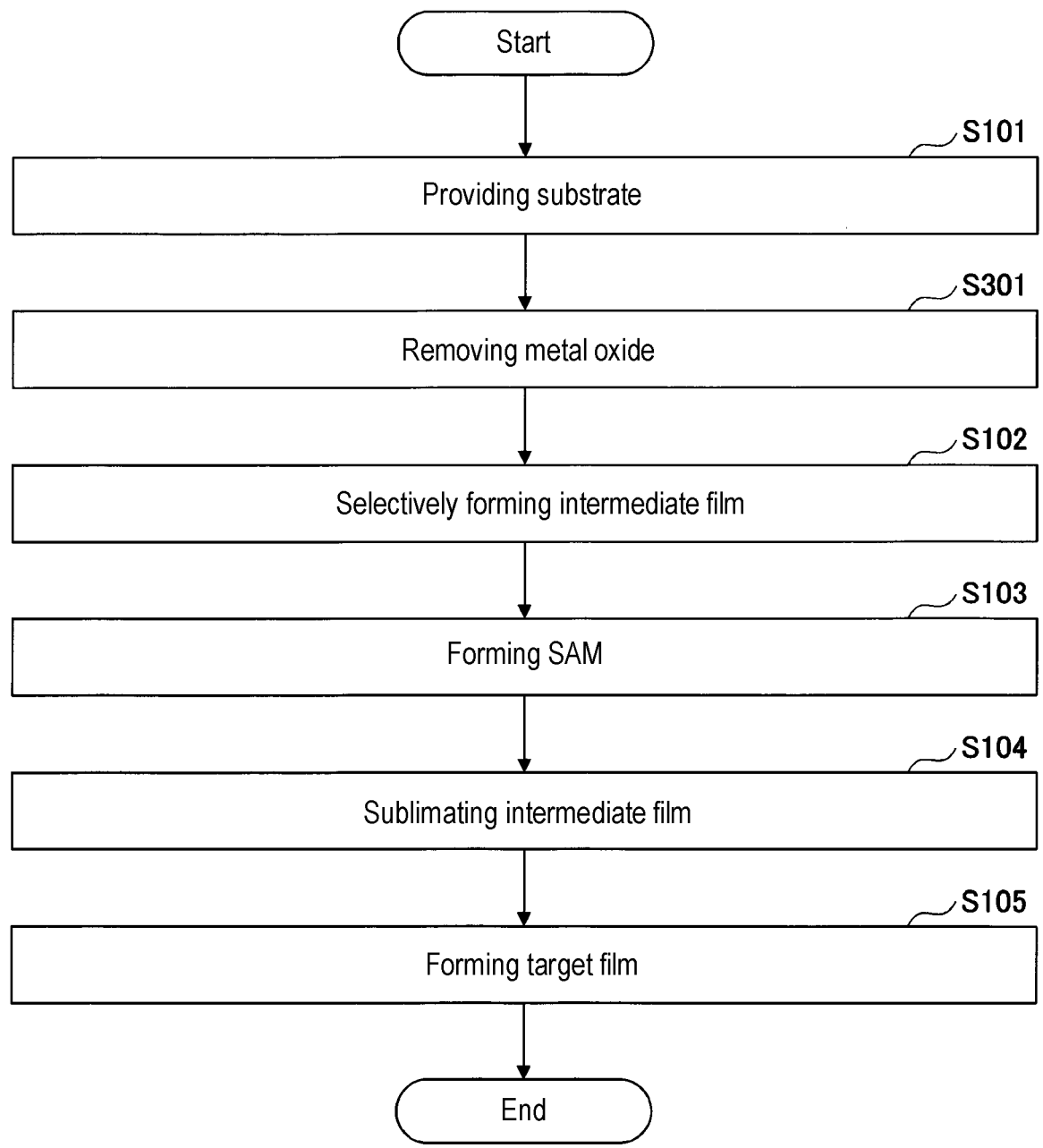

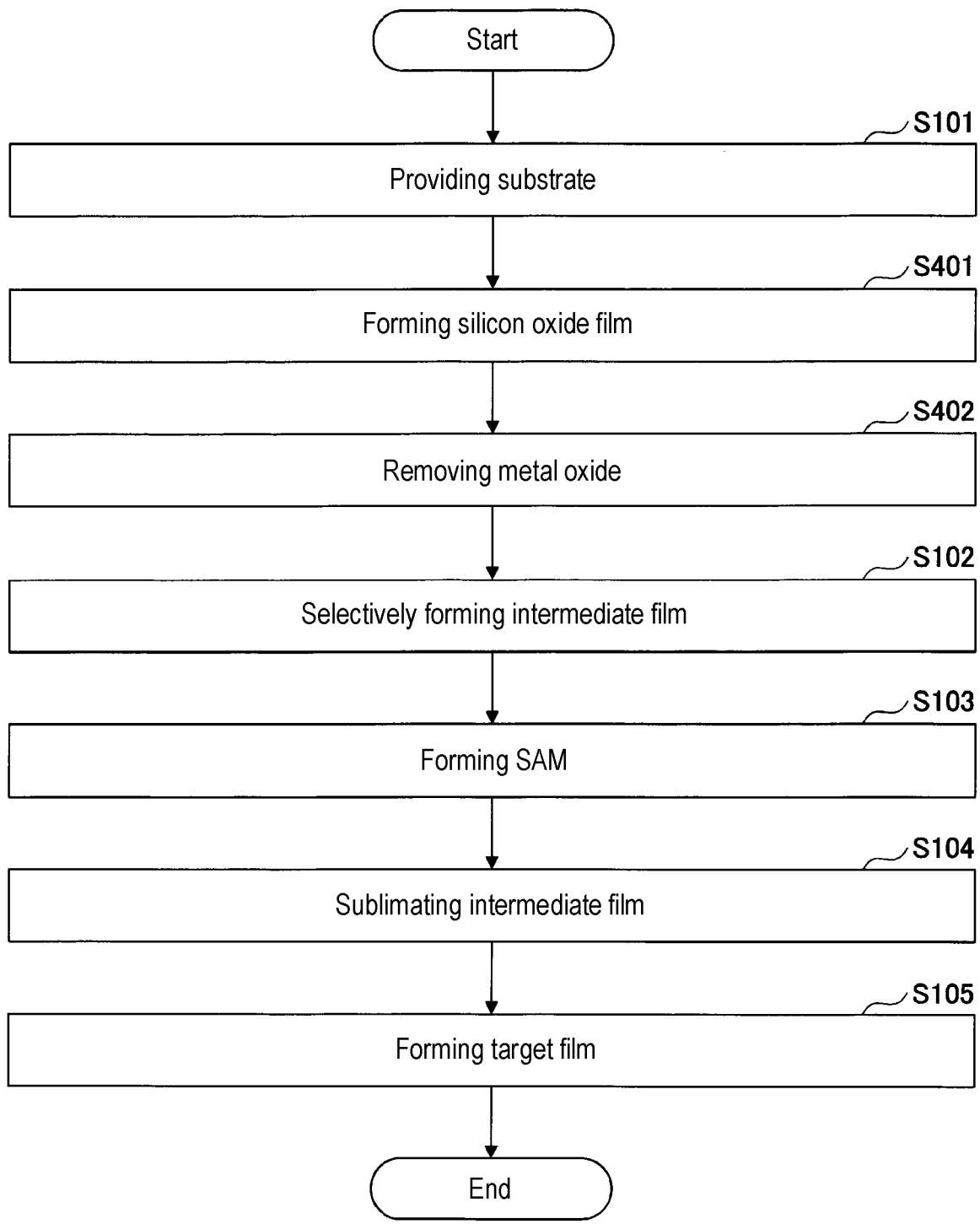

FILM FORMATION METHOD AND FILM FORMATION DEVICE

CROSS-REFERENCE TO RELATED APPLICATIONS

This application is a National Stage Application of International Patent Application No. PCT/JP2020/008869, having an International Filing Date of Mar. 3, 2020, which claims the benefit of priority to Japanese Patent Application No. 2019-046325, filed Mar. 13, 2019, each of which is hereby incorporated by reference herein.

TECHNICAL FIELD

The present disclosure relates to a film formation method and a film formation apparatus.

BACKGROUND

Patent Document 1 discloses a technique for selectively forming a target film in a specific region of a substrate without using a photolithography technique. Specifically, a technique is disclosed in which a self-assembled monolayer (SAM) that inhibits formation of a target film is formed in a partial region of the substrate and the target film is formed in the remaining region of the substrate.

PRIOR ART DOCUMENT

Patent Document

Patent Document 1: Japanese Laid-Open Patent Publication No. 2007-501902

SUMMARY

An aspect of the present disclosure provides a technique capable of removing a SAM that inhibits the formation of a target film from a specific region of a substrate prior to the formation of the target film.

A film formation method of an aspect of the present disclosure includes: providing a substrate including a first region in which a first material is exposed and a second region in which a second material different from the first material is exposed; forming an intermediate film selectively in the second region from the first region and the second region by supplying a processing gas to the substrate; forming a self-assembled monolayer in the first region and the second region after forming the intermediate film; removing the intermediate film and the self-assembled monolayer from the second region by heating the substrate to sublimate the intermediate film; and forming, after the sublimation of the intermediate film, a target film selectively in the second region from the first region and the second region in a state in which the self-assembled monolayer is left in the first region.

According to an aspect of the present disclosure, it is possible to remove, from a specific region of a substrate, an SAM that inhibits the formation of a target film prior to the formation of a target film.

BRIEF DESCRIPTION OF DRAWINGS

FIG. 1 is a flowchart illustrating a film formation method according to a first embodiment.

FIG. 3 is a flowchart illustrating a film formation method according to a second embodiment.

FIG. 5 is a flowchart illustrating a film formation method according to a third embodiment.

FIG. 7 is a flowchart illustrating a film formation method according to a fourth embodiment.

DETAILED DESCRIPTION

Figure 2A:
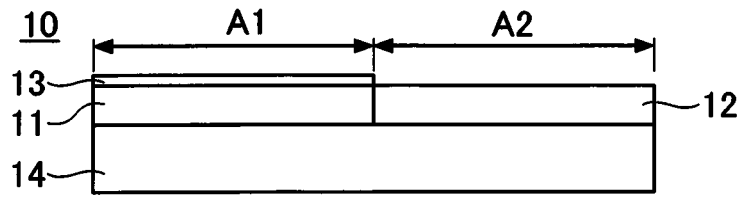
FIGS. 2A to 2E are side views illustrating examples of states of a substrate in respective steps illustrated in FIG. 1.

Hereinafter, embodiments of the present disclosure will be described with reference to the drawings. In addition, in each drawing, the same or corresponding components will be denoted by the same reference numerals, and a description thereof may be omitted.

Figure 2B:
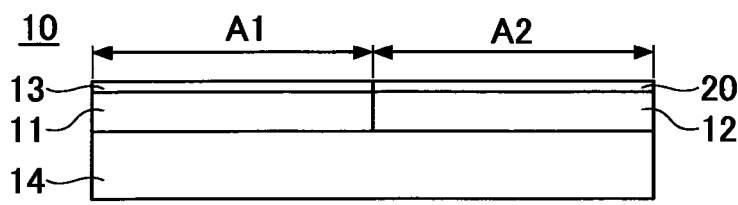
Figure 2C:
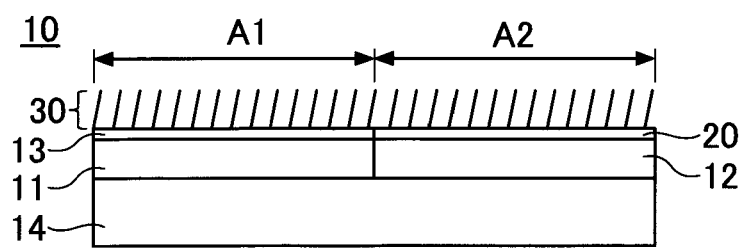
Figure 2D:
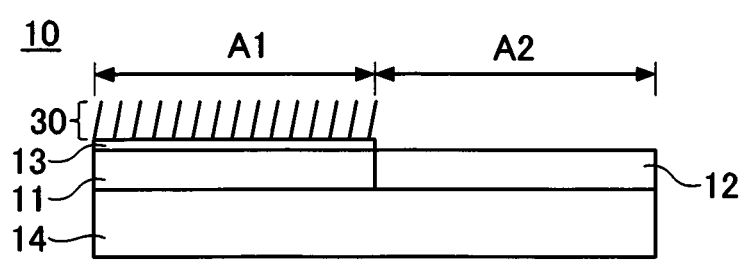
Figure 2E:
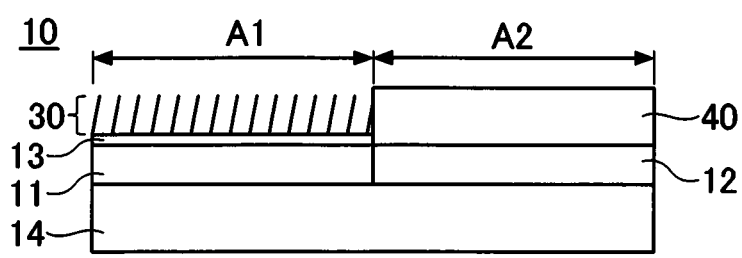

FIG. 1 is a flowchart illustrating a film formation method according to a first embodiment. FIGS. 2A to 2E are side views illustrating examples of states of a substrate in respective steps illustrated in FIG. 1. FIG. 2A illustrates the state of the substrate provided in step S101, FIG. 2B illustrates the state of the substrate obtained in step S102, FIG. 2C illustrates the state of the substrate obtained in step S103, FIG. 2D illustrates the state of the substrate obtained in step S104, and FIG. 2E illustrates the state of the substrate obtained in step S105.

The film formation method includes step S101 of providing a substrate 10, as illustrated in FIG. 2A. Providing the substrate 10 includes, for example, carrying the substrate 10 into a processing container 120 (see FIG. 9) to be described later. The substrate 10 includes a first region A1 in which a first material is exposed and a second region A2 in which a second material different from the first material is exposed. The first region A1 and the second region A2 are provided on one side of the substrate 10 in the thickness direction thereof.

The number of first regions A1 is one in FIG. 2A, but may be two or more. For example, two first regions A1 may be arranged with the second region A2 interposed therebetween. Similarly, the number of second regions A2 is one in FIG. 2A, but may be two or more. For example, two second regions A2 may be arranged with the first region A1 interposed therebetween.

Only the first regions A1 and the second regions A2 are present in FIG. 2A, but a third region may be further present. The third region is a region in which a third material different from the first material and the second material is exposed. The third region may be disposed between the first region A1 and the second region A2, or may be disposed outside the first region A1 and the second region A2.

The first material is, for example, an oxide formed through surface oxidation of a conductive material. The conductive material is, for example, a metal such as Cu, W, Co, or Ru. The surfaces of these metals are naturally oxidized in the atmosphere over time. The oxides correspond to the first material. Although the first material is an oxide formed through surface oxidation of the conductive material in the present embodiment, it may be a conductive material. The oxide film can be removed through reduction process.

The second material is, for example, an insulating material containing silicon (Si), such as a silicon oxide, a silicon nitride, a silicon oxynitride, or a silicon carbide. Hereinafter, the silicon oxide is also referred to as "SiO" regardless of the composition ratio of oxygen and silicon. Similarly, the silicon nitride is also referred to as "SiN," the silicon oxynitride is also referred to as "SiON," and the silicon carbide is also referred to as "SiC." The second material is SiO in the present embodiment.

The substrate 10 has, for example, a conductive film 11 formed of the above-mentioned conductive material, and an insulating film 12 formed of the above-mentioned insulating material. A metal oxide film 13 is naturally formed on the surface of the conductive film 11 in the atmosphere over time. The metal oxide film 13 can be removed through reduction process.

The substrate 10 has a base substrate 14 on which the conductive film 11 and the insulating film 12 are formed. The base substrate 14 is, for example, a semiconductor substrate such as a silicon wafer. In addition, the base substrate 14 may be a glass substrate or the like.

In addition, the substrate 10 may further include, between the base substrate 14 and the conductive film 11, a base film formed of a material different from those of the base substrate 14 and the conductive film 11. Similarly, the substrate 10 may further include, between the base substrate 14 and the insulating film 12, a base film formed of a material different from those of the base substrate 14 and the insulating film 12.

As illustrated in FIG. 2B, the film formation method includes step S102 of forming an intermediate film 20 selectively in the second region A1 from the first region A1 and the second region A2 by supplying a processing gas to the substrate 10. The intermediate film 20 is heated and sublimated after the formation of a self-assembled monolayer (SAM) 30 to be described later. When the third region is present in addition to the first region A1 and the second region A2, the intermediate film 20 may or may not be formed in the third region.

The intermediate film 20 may be, for example, an ammonium fluorosilicate $((NH_4)_2SiF_6)$ film. Since the ammonium fluorosilicate film is sublimated at a relatively low temperature (e.g., 90 degrees C. or higher and 120 degrees C. or lower), the intermediate film can be easily sublimated, which makes it possible to remove the SAM 30 from the second region A2.

The processing gas used for forming the intermediate film 20 (step S102) includes, for example, a hydrogen fluoride (HF) gas and an ammonia $(NH_3)$ gas. The processing gas including the HF gas and the $NH_3$ gas chemically reacts with SiO to form a film of ammonium fluorosilicate.

The processing gas used for forming the intermediate film 20 (step S102) may contain an inert gas such as a nitrogen $(N_2)$ gas or an argon (Ar) gas in addition to the HF gas and the $NH_3$ gas. The inert gas dilutes the HF gas and the $NH_3$ gas.

Since the conductive film 11 is formed of a metal and does not include silicon (Si), which is a semimetal, SiO is not exposed in the first region A1 even if the conductive film 11 is naturally oxidized. That is, the first material is not SiO. Therefore, an ammonium fluorosilicate film is not formed in the first region A1. This is because the ammonium fluorosilicate film is formed in the region in which SiO is exposed.

On the other hand, when the second material is SiO, the SiO is exposed in the second region A2. Therefore, the ammonium fluorosilicate film is formed selectively in the second region A2. The case in which the second material is SiN, SiON, SiC, or the like will be described later.

The formation of the ammonium fluorosilicate is performed in a decompressed atmosphere. The formation of the ammonium fluorosilicate is performed at, for example, 50 degrees C. or lower, preferably 30 degrees C. or lower, in order to suppress the sublimation of the ammonium fluorosilicate.

As illustrated in FIG. 2C, the film formation method includes step S103 of forming the SAM 30 in the first region A1 and the second region A2 after forming the intermediate film 20. The SAM 30 is formed when an organic compound is chemisorbed on the substrate 10 and inhibits the formation of a target film 40 to be described later.

The organic compound forming the SAM 30 is not particularly limited, but is, for example, a silane-based compound. The silane-based compound is, for example, a compound represented by a general formula $R-SiH_{3-x}Cl_x$ (x=1, 2, 3) or a compound represented by $R'-Si(O-R)_3$ (a silane coupling agent). Here, R and R' are functional groups such as an alkyl group or a group obtained by substituting at least a portion of hydrogen of the alkyl group with fluorine. The terminal groups of the functional groups may be either CH-based or CF-based. In addition, O—R is a hydrolyzable functional group, such as a methoxy group or an ethoxy group. An example of the silane coupling agent may include octamethyltrimethoxysilane (OTS).

The silane compound is supplied to the substrate 10, for example, in a gas state and chemisorbed on the substrate 10. Since the silane compound is easily chemisorbed on the surface having an OH group, the silane compound is more easily chemisorbed on a metal compound rather than on a metal, and particularly easily on a metal oxide. Therefore, as a material exposed to the first region A1 in order to cause the silane compound to be chemisorbed in the first region A1, an oxide formed through surface oxidation of a conductive material may be used.

As illustrated in FIG. 2D, the film formation method includes step S104 of sublimating the intermediate film 20 by heating the substrate 10 in order to remove the intermediate film 20 and the SAM 30 from the second region A2. The sublimation of the intermediate film 20 causes the SAM 30 to be lifted off.

Since the intermediate film 20 is formed selectively in the second region A2, the SAM 30 is selectively removed from the second region A2. Since the intermediate film 20 is not formed in the first region A1, the SAM 30 is left in the first region A1.

The intermediate film 20 is, for example, an ammonium fluorosilicate film. Since the ammonium fluorosilicate film is sublimated at a relatively low temperature (e.g., 90 degrees C. or higher and 120 degrees C. or lower), the SAM 30 can be removed from the second region A2 while suppressing the thermal decomposition of the SAM 30 in the first region A1.

According to the present embodiment, since the SAM 30 can be removed through dry process, the occurrence of a watermark or the like can be suppressed. In addition, since the SAM 30 can be removed without plasma, damage to the substrate 10 can be suppressed.

As illustrated in FIG. 2E, the film formation method includes step 105 of forming the target film 40 selectively in the second region A2 from the first region A1 and the second region A2 using the SAM 30 left in the first region A1 after the sublimation of the intermediate film 20. The target film 40 is formed of a material different from that of the SAM 30, such as a metal, a metal compound, or a semiconductor. Since the SAM 30 inhibits the formation of the target film 40, the target film 40 is formed selectively in the second region A2. When a third region exists in addition to the first region A1 and the second region A2, the target film 40 may or may not be formed in the third region.

The target film 40 is formed through, for example, a chemical vapor deposition (CVD) method or an atomic layer deposition (ALD) method. The target film 40 is formed of, for example, an insulating material. The target film 40, which is an insulating film, may be further laminated on the insulating film 12 originally existing in the second region A2.

The target film 40 is formed of, for example, an insulating material including silicon. The insulating material including silicon is, for example, a silicon oxide (SiO), a silicon nitride (SiN), a silicon oxynitride (SiON), or a silicon carbide (SiC).

When the target film 40 is an insulating material including silicon, for example, when the target film 40 is SiO, it is possible to form the intermediate film 20 again on the surface of the target film 40. Therefore, the formation of the intermediate film 20 (step S102), the formation of the SAM 30 (step S103), the sublimation of the intermediate film 20 (step S104), and the formation of the target film 40 (step S105) may be repeated. As a result, a thick target film 40 may be formed.

As described above, according to the present embodiment, after the formation of the intermediate film 20, the SAM 30 is formed in both the first region A1 and the second region A2. Therefore, a surface modification process, such as the oxidation process or the reduction process for selectively forming the SAM 30, becomes unnecessary. It is difficult to apply the oxidation process or the reduction process to only one of the first region A1 and the second region A2, but such a surface modification process becomes unnecessary. A difference between exposed materials is used for the selective formation of the intermediate film 20 so that the selective formation of the intermediate film 20 can be easily implemented.

According to the present embodiment, the intermediate film 20 is formed selectively in the second region A2, and the SAM 30 is removed from the second region A2 by sublimating the intermediate film 20. That is, according to the present embodiment, the lift-off of the SAM 30 is implemented through the sublimation of the intermediate film 20. Therefore, before the formation of the target film 40, the SAM 30, which inhibits the formation of the target film 40, can be removed from the second region A2. As a result, the region in which the SAM 30 is formed may be limited to the first region A1, and the region in which the target film 40 is formed may be limited to the second region A2.

The film formation method may include an additional step between the providing of the substrate 10 (step S101) and the formation of the intermediate film 20 (step S102). The additional step may include, for example, a step of growing the metal oxide film 13 or a step of increasing the density of OH groups of the metal oxide film 13. Through these steps, the silane compound can be chemisorbed densely in the first region A1, and the target film 40 can be formed selectively in the second region A2.

The growth of the metal oxide film 13 is implemented by actively oxidizing the surface of the conductive film 11. In addition, the increase in the density of the OH groups is implemented, for example, by exposing the metal oxide film 13 to hydrogen plasma. Hydrogen plasma enables the increase of the density of the OH groups, but reduces the thickness of the metal oxide film 13. Thus, it is effective to grow the metal oxide film 13 in advance. The growth of the metal oxide film 13 is, in other words, an increase in the film thickness of the metal oxide film 13.

Figure 4A:
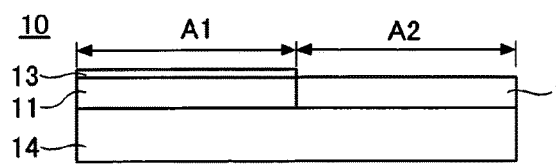
FIGS. 4A to 4F are side views illustrating examples of states of a substrate in respective steps illustrated in FIG. 3.
Figure 4B:
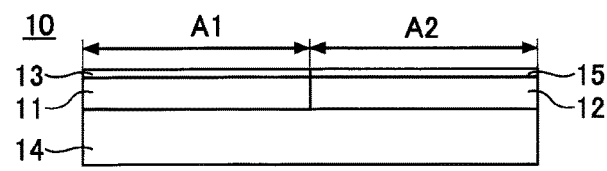
Figure 4C:
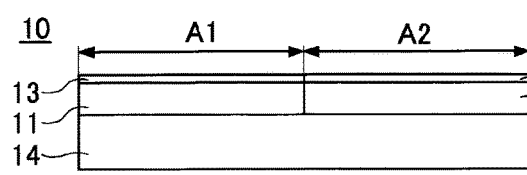
Figure 4D:
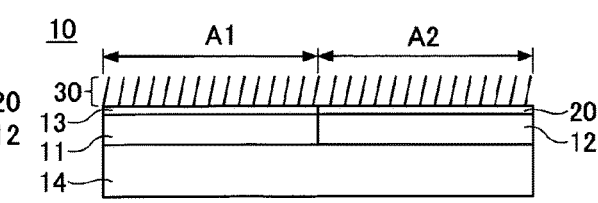
Figure 4E:
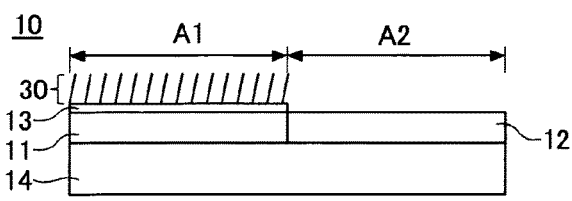
Figure 4F:
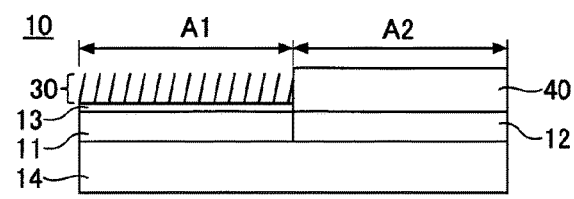

FIG. 3 is a flowchart illustrating a film formation method according to a second embodiment. FIGS. 4A to 4F are side views illustrating examples of states of a substrate in respective steps illustrated in FIG. 3. FIG. 4A illustrates the state of the substrate provided in step S101, FIG. 4B illustrates the state of the substrate obtained in step S201, FIG. 4C illustrates the state of the substrate obtained in step S102, FIG. 4D illustrates the state of the substrate obtained in step S103, FIG. 4E illustrates the state of the substrate obtained in step S104, and FIG. 4F illustrates the state of the substrate obtained in step S105. Hereinafter, differences between the film formation method of the present embodiment and the film formation method of the first embodiment will be mainly described.

As illustrated in FIG. 4A, the film formation method includes step S101 of providing the substrate 10. The substrate 10 includes a first region A1 from which a first material is exposed and a second region A2 from which a second material different from the first material is exposed. The second material is an insulating material containing silicon other than SiO, such as SiN, SiON, or SiC. Since SiO is not exposed in the second region A2, no intermediate film 20 is formed in the second region A2 as it is. This is because an ammonium fluorosilicate film as the intermediate film 20 is formed in a region in which SiO is exposed.

As illustrated in FIG. 4B, the film formation method includes step S201 of forming a silicon oxide film 15 exposed in the second region A2 by surface-oxidizing the second region A2 before forming the intermediate film 20. The silicon oxide film 15 is formed by exposing the surface of the insulating film 12 formed of, for example, SiN, SiON, or SiC, to an oxidizing gas, such as an oxygen ($O_2$) gas, an ozone ($O_3$) gas, or a water vapor ($H_2O$) gas. Oxidation may be implemented at room temperature or may be implemented at a high temperature to facilitate oxidation. In addition, the oxidizing gas may be plasmarized in order to facilitate the oxidation. Furthermore, the oxidation may be implemented through a wet process rather than through the dry process.

When the second region A2 is surface-oxidized, the first region A1 can also be surface-oxidized so that the metal oxide film 13 can be grown. Since the metal oxide film 13 has been obtained by oxidizing the surface of the conductive film 11, SiO is not exposed in the first region A1.

As illustrated in FIG. 4C, the film formation method includes step S102 of forming an intermediate film 20 selectively in the second region A1 from the first region A1 and the second region A2 by supplying a processing gas to the substrate 10. The intermediate film 20 is, for example, an ammonium fluorosilicate film. The ammonium fluorosilicate film is not formed in the first region A1 in which SiO is not exposed, but is formed selectively in the second region A2 in which SiO is exposed.

In FIG. 4C, all of the silicon oxide film 15 illustrated in FIG. 4B is replaced with the intermediate film 20, and the silicon oxide film 15 does not remain between the intermediate film 20 and the insulating film 12. However, the silicon oxide film 15 may remain. This is because even if the silicon oxide film 15 remains, the lift-off of the SAM 30 can be implemented through the sublimation of the intermediate film 20.

The film formation method includes the formation of the SAM 30 illustrated in FIG. 4D (step S103), the sublimation of the intermediate film 20 illustrated in FIG. 4E (step S104), and the formation of the target film 40 illustrated in FIG. 4F (step S105). Since these steps S103 to S105 are the same as steps S103 to S105 of the first embodiment, a description thereof will be omitted.

As described above, according to the present embodiment, as in the first embodiment, after the intermediate film 20 is formed, since the SAM 30 is formed in both the first region A1 and the second region A2, and since the intermediate film 20 is formed selectively in the second region A2 and the SAM 30 is removed from the second region A2 by sublimating the intermediate film 20, the same effects as those of the first embodiment are obtained.

In addition, according to the present embodiment, unlike the first embodiment, the silicon oxide film 15 exposed in the second region A2 is formed by surface-oxidizing the second region A2 before forming the intermediate film 20. The silicon oxide film 15 is formed by oxidizing the surface of the insulating film 12 formed of, for example, SiN, SiON, or SiC. Even when the insulating film 12 is formed of an insulating material including silicon other than SiO, SiO can be exposed in the second region A2, and as a result, an ammonium fluorosilicate film can be formed in the second region A2.

Figure 6A:
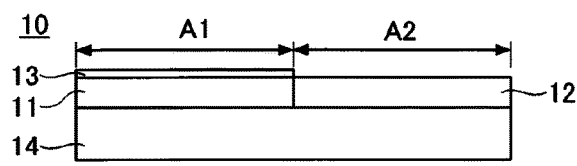
FIGS. 6A to 6F are side views illustrating examples of states of a substrate in respective steps illustrated in FIG. 5.
Figure 6B:
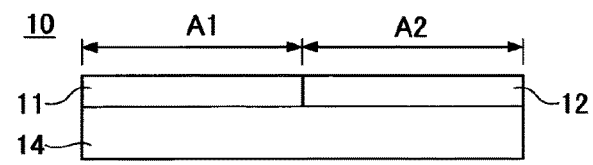
Figure 6C:
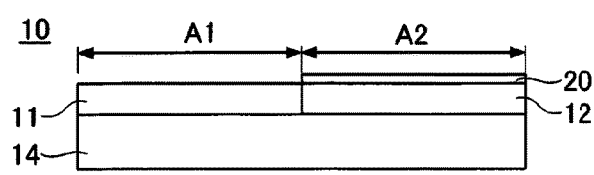
Figure 6D:
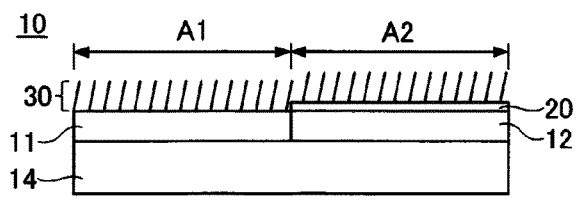
Figure 6E:
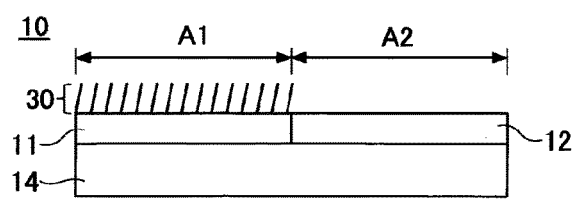
Figure 6F:
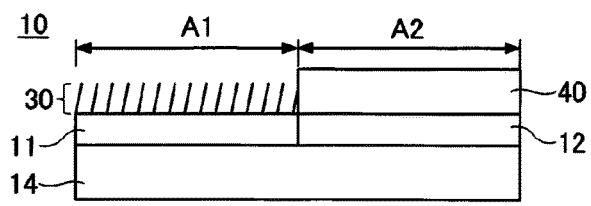

FIG. 5 is a flowchart illustrating a film formation method according to a third embodiment. FIGS. 6A to 6F are side views illustrating examples of states of a substrate in respective steps illustrated in FIG. 5. FIG. 6A illustrates the state of the substrate provided in step S101, FIG. 6B illustrates the state of the substrate obtained in step S301, FIG. 6C illustrates the state of the substrate obtained in step S102, FIG. 6D illustrates the state of the substrate obtained in step S103, FIG. 6E illustrates the state of the substrate obtained in step S104, and FIG. 6F illustrates the state of the substrate obtained in step S105. Hereinafter, differences between the film formation method of the present embodiment and the film formation method of the first embodiment will be mainly described.

As illustrated in FIG. 6A, the film formation method includes step S101 of providing a substrate 10. The substrate 10 includes a first region A1 in which a first material is exposed and a second region A2 in which a second material different from the first material is exposed. The first material is, for example, an oxide formed through surface oxidation of a conductive material. The conductive material is, for example, a metal such as Cu, W, Co, or Ru. The surfaces of these metals are naturally oxidized in the atmosphere over time. The oxides correspond to the first material. On the other hand, the second material is SiO.

In the present embodiment, unlike the first embodiment, a thiol-based compound is used as the material of the SAM 30 instead of a silane-based compound. The thiol-based compound is, for example, a compound represented by a general formula R—SH. Here, R is an aliphatic hydrocarbon group or a group obtained when a carbon atom or a hydrogen atom of an aliphatic hydrocarbon group is substituted with a hetero atom, or an aromatic hydrocarbon group or a group obtained when a carbon atom or a hydrogen atom of an aromatic hydrocarbon group is substituted with a hetero atom.

Like the silane-based compound, the thiol-based compound is supplied to the substrate 10 in a gas state and chemisorbed on the substrate 10. Unlike the silane-based compound, the thiol-based compound is basically chemisorbed on a metal without being chemisorbed on a metal compound. Since the first material exposed in the first region A1 is an oxide formed through surface oxidation of a conductive material, no SAM 30 is formed in the first region A1 as it is.

Therefore, as illustrated in FIG. 6B, the film formation method includes step S301 of removing a metal oxide film 13 exposed in the first region A1 before forming the intermediate film 20. The metal oxide film 13 is, for example, a film formed when the surface of the conductive film 11 is naturally oxidized. By removing the metal oxide film 13, the conductive film 11 can be exposed, and the thiol-based compound can be chemisorbed on the conductive film 11.

The removal of the metal oxide film 13 is implemented, for example, by exposing the metal oxide film 13 to a reducing gas such as a formic acid ($CH_2O_2$) gas or a hydrogen ($H_2$) gas. The hydrogen gas is usually plasmarized. The removal of the metal oxide film 13 may be implemented though a wet process rather than through a dry process, and may be implemented through, for example, cleaning with diluted hydrofluoric acid.

When the metal oxide film 13 is removed, the insulating film 12 is hardly reduced. This is because SiO forming the insulating film 12 is superior in stability compared with the oxide of a metal such as Cu, W, Co, or Ru. Therefore, after the metal oxide film 13 is removed, SiO remains exposed in the second region A2.

The film formation method includes the formation of the intermediate film 20 illustrated in FIG. 6C (step S102), the formation of the SAM 30 illustrated in FIG. 6D (step S103), the sublimation of the intermediate film 20 illustrated in FIG. 6E (step S104), and the formation of the target film 40 illustrated in FIG. 6F (step S105). Since these steps S102 to S105 are the same as steps S102 to S105 of the first embodiment, a description thereof will be omitted.

As described above, the thiol-based compound is basically chemisorbed on a metal without being chemisorbed on a metal compound. However, since the selectivity is not perfect, the thiol-based compound is slightly adsorbed on the metal compound as well. Therefore, in step S103, the SAM 30 may be formed not only in the first region A1, but also in the second region A2. Such a break in selectivity can be eliminated through the lift-off of the SAM 30 accompanying the sublimation of the intermediate film 20, and the SAM 30 can be left only in the first region A1.

As described above, according to the present embodiment, as in the first embodiment, after the intermediate film 20 is formed, since the SAM 30 is formed in both the first region A1 and the second region A2, and since the intermediate film 20 is formed selectively in the second region A2 and the SAM 30 is removed from the second region A2 by sublimating the intermediate film 20, the same effects as those of the first embodiment are obtained.

In addition, according to the present embodiment, unlike the first embodiment, the metal oxide film 13 exposed in the first region A1 is removed before forming the intermediate film 20. The metal oxide film 13 is, for example, the surface of the conductive film 11 that has been naturally oxidized. By removing the metal oxide film 13, the conductive film 11 can be exposed, and the thiol-based compound can be chemisorbed on the conductive film 11.

Figure 8A:
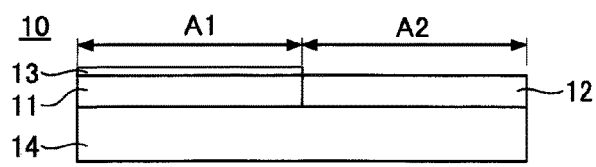
FIGS. 8A to 8G are side views illustrating examples of states of a substrate in respective steps illustrated in FIG. 7.
Figure 8B:
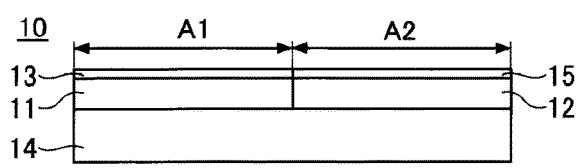
Figure 8C:
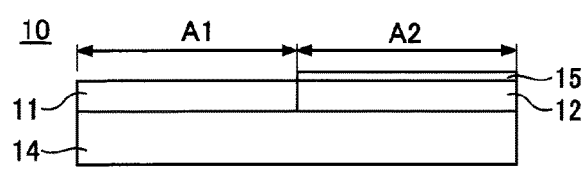

FIG. 7 is a flowchart illustrating a film formation method according to a fourth embodiment. FIGS. 8A to 8G are side views illustrating examples of states of a substrate in respective steps illustrated in FIG. 7. FIG. 8A illustrates the state of the substrate provided in step S101, FIG. 8B illustrates the state of the substrate obtained in step S401, FIG. 8C illustrates the state of the substrate obtained in step S402, FIG.

Figure 8D:
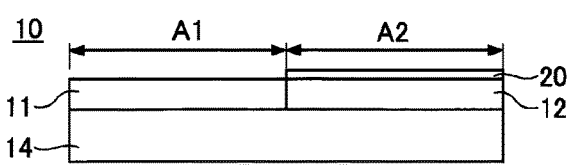
Figure 8E:
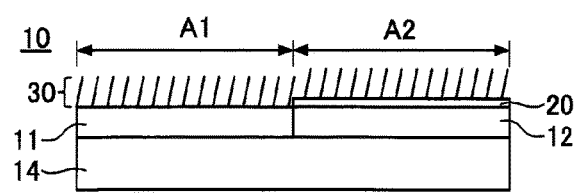
Figure 8F:
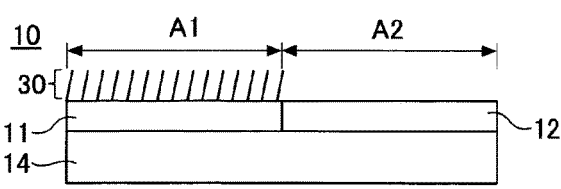
Figure 8G:
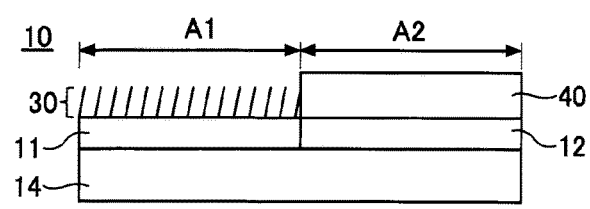

8D illustrates the state of the substrate obtained in step S102, FIG. 8E illustrates the state of the substrate obtained in step S103, FIG. 8F illustrates the state of the substrate obtained in step S104, and FIG. 8G illustrates the state of the substrate obtained in step S105. Hereinafter, differences between the film formation method of the present embodiment and the film formation method of the first embodiment will be mainly described.

As illustrated in FIG. 8A, the film formation method includes step S101 of providing a substrate 10. The substrate 10 includes a first region A1 from which a first material is exposed and a second region A2 from which a second material different from the first material is exposed. The first material is, for example, an oxide formed through surface oxidation of a conductive material. The conductive material is, for example, a metal such as Cu, W, Co, or Ru. The surfaces of these metals are naturally oxidized in the atmosphere over time. The oxides correspond to the first material.

On the other hand, unlike the first embodiment, the second material is an insulating material including silicon other than SiO, as in the second embodiment, and is, for example, SiN, SiON, or SiC. Since SiO is not exposed in the second region A2, no intermediate film 20 is formed in the second region A2 as it is. This is because an ammonium fluorosilicate film used as the intermediate film 20 is formed in a region in which SiO is exposed.

Thus, as illustrated in FIG. 8B, the film formation method includes step S401 of forming a silicon oxide film 15 exposed in the second region A2 by surface-oxidizing the second region A2 before forming the intermediate film 20. Since this step S401 is the same as step S201 of the second embodiment, a description thereof will be omitted.

In the present embodiment, unlike the first embodiment, a thiol-based compound is used as the material of the SAM 30 instead of a silane-based compound, as in the third embodiment. Unlike the silane-based compound, the thiol-based compound is basically chemisorbed on a metal without being chemisorbed on a metal compound. Since the first material exposed in the first region A1 is an oxide formed through surface oxidation of a conductive material, no SAM 30 is formed in the first region A1 as it is.

Therefore, as illustrated in FIG. 8C, the film formation method includes step S402 of removing the metal oxide film 13 exposed in the first region A1 after forming the silicon oxide film 15 and before forming the intermediate film 20. Since this step S402 is the same as step S301 of the third embodiment, a description thereof will be omitted.

Here, the metal oxide film 13 is removed after the formation of the silicon oxide film 15 because the silicon oxide film 15 is superior in stability compared to the metal oxide film 13. That is, this is because the metal oxide film 13 can be removed in the state in which the silicon oxide film 15 is left since the silicon oxide film 15 is also thinned when the metal oxide film 13 is removed, but the thinning rate of the silicon oxide film 15 is lower than the thinning rate of the metal oxide film 13.

The film formation method includes the formation of the intermediate film 20 illustrated in FIG. 8D (step S102), the formation of the SAM 30 illustrated in FIG. 8E (step S103), the sublimation of the intermediate film 20 illustrated in FIG. 8F (step S104), and the formation of the target film 40 illustrated in FIG. 8G (step S105). Since these steps S102 to S105 are the same as steps S102 to S105 of the first embodiment, a description thereof will be omitted.

As described above, according to the present embodiment, as in the first embodiment, since the SAM 30 is formed in both the first region A1 and the second region A2 after forming the intermediate film 20, and since the intermediate film 20 is formed selectively in the second region A2 and the SAM 30 is removed from the second region A2 by sublimating the intermediate film 20, the same effects as those of the first embodiment are obtained.

In addition, according to the present embodiment, unlike the first embodiment, since the silicon oxide film 15 exposed in the second region A2 is formed by surface-oxidizing the second region A2 before forming the intermediate film 20 as in the second embodiment, the same effects as those of the second embodiment are obtained.

In addition, according to the present embodiment, unlike the first embodiment, since the metal oxide film 13 exposed in the first region A1 is removed before forming the intermediate film 20 as in the third embodiment, the same effects as those of the third embodiment are obtained. Here, the metal oxide film 13 is removed after the formation of the silicon oxide film 15 because the silicon oxide film 15 is superior in stability compared to the metal oxide film 13.

Figure 9:
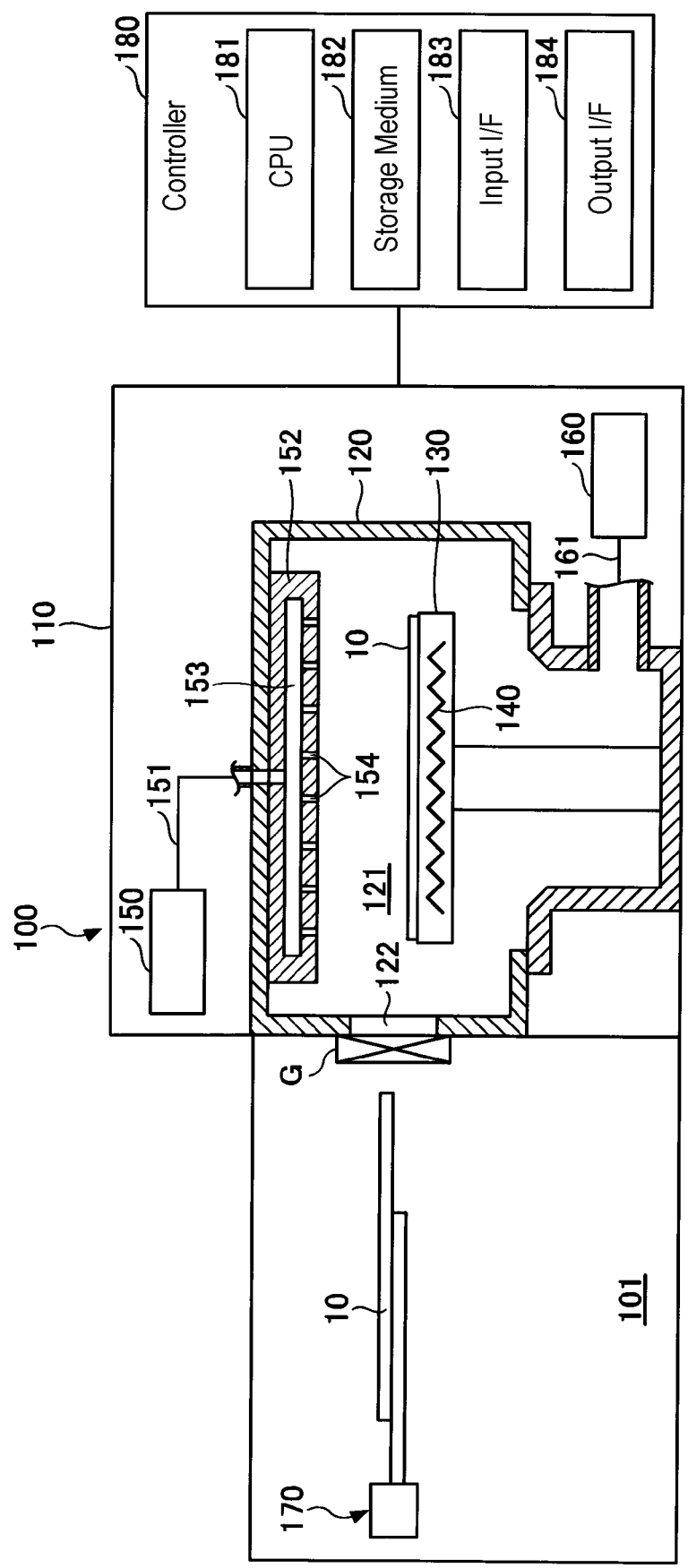
FIG. 9 is a cross-sectional view illustrating an example of a film formation apparatus that implements the film formation method illustrated in FIG. 1 to FIG. 8G.

FIG. 9 is a cross-sectional view illustrating an example of a film formation apparatus that implements the film formation methods illustrated in FIG. 1 to FIG. 8G. A film formation apparatus 100 includes a processing unit 110, a transfer device 170, and a controller 180. The processing unit 110 includes a processing container 120, a substrate holder 130, a heater 140, a gas supplier 150, and a gas discharger 160.

Although a single processing unit 110 is illustrated in FIG. 9, a plurality of processing units 110 may be provided. The plurality of processing units 110 form a so-called multichamber system. The plurality of processing units 110 are arranged to surround a vacuum transfer chamber 101. The vacuum transfer chamber 101 is exhausted by a vacuum pump and is maintained at a preset degree of vacuum. In the vacuum transfer chamber 101, the transfer device 170 is disposed to be movable in the vertical direction and the horizontal direction and to be rotatable around the vertical axis. The transfer device 170 transfers substrates 10 to a plurality of processing containers 120. A processing chamber 121 inside the processing container 120 and the vacuum transfer chamber 101 communicate with each other when internal pressures thereof are both lower than the atmospheric pressure, so that the substrate 10 is transferred therebetween. Unlike the case in which an atmospheric transfer chamber is provided instead of the vacuum transfer chamber 101, it is possible to prevent air from flowing from the atmospheric transfer chamber into the interior of the processing chamber 121 during the transfer of the substrate 10. It is possible to reduce the waiting time for lowering the internal pressure of the processing chamber 121, which makes it possible to improve the processing rate of the substrate 10.

The processing container 120 has a loading/unloading port 122 through which the substrate 10 passes. A gate G is provided in the loading/unloading port 122 to open/close the loading/unloading port 122. The gate G basically closes the loading/unloading port 122, and opens the loading/unloading port 122 when the substrate 10 passes through the loading/unloading port 122. When the loading/unloading port 122 is opened, the processing chamber 121 inside the processing container 120 and the vacuum transfer chamber 101 communicate with each other. Before opening the loading/unloading port 122, both the processing chamber 121 and the vacuum transfer chamber 101 are exhausted by a vacuum pump or the like and maintained at a preset pressure.

The substrate holder 130 holds the substrate 10 inside the processing container 120. The substrate holder 130 holds the substrate 10 horizontally from below with the surface of the substrate 10 exposed to the processing gas facing upwards. The substrate holder 130 is a single-wafer type and holds one sheet of the substrate 10. The substrate holder 130 may be a batch type, or may hold a plurality of substrates 10 at the same time. The batch-type substrate holder 130 may hold the plurality of substrates 10 at intervals in the vertical direction or at intervals in the horizontal direction.

The heater 140 heats the substrate 10 held by the substrate holder 130. The heater 140 is, for example, an electric heater, and generates heat when electric power is supplied thereto. The heater 140 is embedded in, for example, the substrate holder 130 and heats the substrate holder 130 to heat the substrate 10 to a desired temperature. The heater 140 may include a lamp configured to heat the substrate holder 130 through a quartz window. In this case, an inert gas such as an argon gas may be supplied to a space between the substrate holder 130 and the quartz window while the substrate holder 130 is heated by the heater 140 in order to prevent the quartz window from becoming opaque due to deposits. In addition, the heater 140 may heat the substrate 10 disposed inside the processing container 120 from the outside of the processing container 120.

The processing unit 110 may further include a cooler configured to cool the substrate 10 in addition to the heater 140 configured to heat the substrate 10. It is possible not only to increase the temperature of the substrate 10 at high speed, but also to decrease the temperature of the substrate 10 at high speed. On the other hand, when the processing of the substrate 10 is performed at room temperature, the processing unit 110 does not have to include the heater 140 and the cooler.

The gas supplier 150 supplies preset processing gases to the substrate 10. The processing gases are prepared for respective steps S102, S103, S104, S105, S201, S301, S401, and S402.

The processing gas used for the formation the intermediate film 20 (step S102) includes, for example, a hydrogen fluoride (HF) gas and an ammonia ($NH_3$) gas, and may further include an inert gas that dilutes these gases.

The processing gas used for the formation of the SAM 30 (step S103) may include, for example, a silane-based compound or thiol-based compound gas, and may further include an inert gas that dilutes these gases.

The processing gas used for the sublimation of the intermediate film 20 (step S104) is, for example, an inert gas such as a nitrogen gas or an argon gas. The inert gas is supplied as a purge gas and expels the gas generated due to the sublimation of the intermediate film 20 from the inside of the processing container 120 to the outside. The inert gas may be supplied as a heat transfer gas that regulates the temperature of the substrate 10. When the intermediate film 20 is sublimated, the processing gas does not have to be supplied to the interior of the processing container 120. That is, the sublimation of the intermediate film 20 may be implemented in a vacuum.

The processing gas used for the formation of the target film 40 (step S105) is a gas of the material of the target film 40. The method for forming the target film 40 is, for example, a CVD method or an ALD method. The material gas of the target film 40 may be heated to a high temperature in order to facilitate a chemical reaction. The material gas of the target film 40 may be plasmarized in order to facilitate the chemical reaction.

For example, when a SiO film is formed as the target film 40 through the ALD method, a Si-containing gas, such as a dichlorosilane ($SiH_2Cl_2$) gas, and an oxidizing gas, such as an ozone ($O_3$) gas, are alternately supplied to the substrate 10 as processing gases. In addition to the Si-containing gas and the oxidizing gas, a modifying gas, such as a hydrogen ($H_2$) gas, may be supplied to the substrate 10.

In addition, when a SiN film is formed as the target film 40 through the ALD method, a Si-containing gas, such as a dichlorosilane ($SiH_2Cl_2$) gas, and a nitriding gas, such as an ammonia ($NH_3$) gas, are alternately supplied to the substrate 10 as processing gases. In addition to the Si-containing gas and the nitriding gas, a modifying gas, such as a hydrogen ($H_2$) gas, may be supplied to the substrate 10.

The processing gas used for the formation of the silicon oxide film 15 (step S201 or step S401) is, for example, an oxidizing gas such as an oxygen ($O_2$) gas, an ozone ($O_3$) gas, or a water vapor ($H_2O$) gas. Oxidation may be implemented at room temperature or may be implemented at a high temperature to facilitate oxidation. In addition, the oxidizing gas may be plasmarized in order to facilitate the oxidation. Furthermore, the oxidation may be implemented through a wet process rather than through a dry process.

The processing gas used for removing the metal oxide film 13 (step S301 or step S402) is, for example, a reducing gas, such as a formic acid ($CH_2O_2$) gas or a hydrogen ($H_2$) gas. Hydrogen gas is usually plasmarized. In addition, the removal of the metal oxide film 13 may be implemented though a wet process rather than through a dry process, and may be implemented through, for example, cleaning with diluted hydrofluoric acid.

The gas supplier 150 supplies preset processing gases to the substrate 10. The processing gases are prepared, for example, for respective steps S102, S103, S104, S105, S201, S301, S401, and S402. These steps may be implemented inside different processing containers 120, respectively, or two or more of any combinations may be implemented continuously inside the same processing container 120. In the latter case, the gas supplier 150 supplies a plurality of types of processing gases to the substrate 10 in a preset order according to the order of the steps.

The gas supplier 150 is connected to the processing container 120 via, for example, a gas supply pipe 151. The gas supplier 150 includes processing gas sources, individual pipes individually extending from respective sources to the gas supply pipe 151, an opening/closing valve provided in each of the individual pipes, and a flow rate controller provided in each of the individual pipes. When the opening/closing valve opens the corresponding individual pipe, the corresponding processing gas is supplied from the source thereof to the gas supply pipe 151. The supply amount of the processing gas is controlled by the flow rate controller. Meanwhile, when the opening/closing valve closes the corresponding individual pipe, the supply of the corresponding processing gas from the source thereof to the gas supply pipe 151 is stopped.

The gas supply pipe 151 supplies the processing gas supplied from the gas supplier 150 to the interior of the processing container 120, for example, a shower head 152. The shower head 152 is provided above the substrate holder 130. The shower head 152 has a space 153 provided therein, and ejects the processing gas stored in the space 153 vertically downward from a large number of gas ejection holes 154. The processing gas is supplied to the substrate 10 in the form of a shower.

The gas discharger 160 discharges the gas from the interior of the processing container 120. The gas discharger 160 is connected to the processing container 120 via an exhaust pipe 161. The gas discharger 160 includes an exhaust source, such as a vacuum pump, and a pressure controller. When the exhaust source is operated, the gas is discharged from the interior of the processing container 120. The internal pressure of the processing container 120 is controlled by a pressure controller.

The controller 180 is constituted with, for example, a computer, and includes a central processing unit (CPU) 181 and a storage medium 182 such as a memory. The storage medium 182 stores a program for controlling various processes to be executed in the film formation apparatus 100. The controller 180 controls the operation of the film formation apparatus 100 by causing the CPU 181 to execute the program stored in the storage medium 182. The controller 180 includes an input interface 183 and an output interface 184. The controller 180 receives a signal from the outside using the input interface 183 and transmits a signal to the outside using the output interface 184.

The controller 180 controls the heater 140, the gas supplier 150, the gas discharger 160, and the transfer device 170 so as to implement the film formation methods illustrated in FIG. 1 to FIG. 8G. The controller 180 also controls the gate G.

In the formation of the intermediate film 20 (step S102) and the formation of the SAM 30 (step S103), the temperature of the substrate 10 is lower than that in the sublimation of the intermediate film 20 (step S104) and is, for example, 50 degrees C. or lower, preferably 30 degrees C. or lower. This makes it possible to suppress disappearance of the intermediate film 20 before the formation of the SAM 30 is completed.

Meanwhile, in the sublimation of the intermediate film 20 (step S104), in order to cause the intermediate film 20 to disappear, the temperature of the substrate 10 is relatively high and is, for example, 90 degrees C. or higher. In the sublimation of the intermediate film 20 (step S104), the temperature of the substrate 10 is, for example, 120 degrees C. or lower such that the SAM 30 having a sufficient film thickness remains in the first region A1 after the sublimation of the intermediate film 20.

As described above, the temperature of the substrate 10 in the formation of the intermediate film 20 (step S102) and the formation of the SAM 30 (step S103) and the temperature of the substrate 10 in the sublimation of the intermediate film 20 (step S104) are different from each other.

Therefore, the controller 180 may implement the formation of the intermediate film 20 (step S102) and the formation of the SAM 30 (step S103) inside one processing container 120 and implement the sublimation of the intermediate film 20 (step S104) inside another processing container 120. Since the temperature of the substrate 10 can be changed by transferring the substrate 10 between two processing containers 120 having different internal temperatures, the time required for adjusting the internal temperature of the processing container 120 can be reduced.

In the formation of the intermediate film 20 (step S102) and the formation of the SAM 30 (step S103), the temperature of the substrate 10 may be room temperature. In this case, the processing unit 110, which performs the formation of the intermediate film 20 (step S102) and the formation of the SAM 30 (step S103), may not include the heater 140.

However, the formation of the target film 40 (step S105) is implemented at a high temperature, similarly to the sublimation of the intermediate film 20 (step S104). The formation of the target film 40 (step S105) is implemented at a high temperature from the viewpoint of a film formation rate of the target film 40.

Therefore, the controller 180 may implement the sublimation of the intermediate film (step S104) and the formation of the target film 40 (step S105) inside the same processing container 120. The time for transferring the substrate 10 between the plurality of processing containers 120 can be reduced, thus increasing a processing rate of the substrate 10. In addition, the number of processing units 110 can be reduced, thus downsizing the film formation apparatus 100.

The controller 180 may implement the formation of the intermediate film 20 (step S102), the formation of the SAM 30 (step S103), the sublimation of the intermediate film 20 (step S104), and the formation of the target film 40 (step S105) inside different processing containers 120, respectively. Since the processing containers 120 are changed depending on types of processing gases, an unintended chemical reaction between a plurality of types of processing gases can be suppressed, thus suppressing the generation of an unintended product.

In addition, the controller 180 may implement the formation of the intermediate film 20 (step S102), the formation of the SAM 30 (step S103), the sublimation of the intermediate film 20 (step S104), and the formation of the target film 40 (step S105) inside the same processing container 120. The time for transferring the substrate 10 between the plurality of processing containers 120 can be reduced, thus increasing a processing rate of the substrate 10. In addition, the number of processing units 110 can be reduced, thus downsizing the film formation apparatus 100.

Although the embodiments of the film formation method and the film formation apparatus according to the present disclosure have been described above, the present disclosure is not limited to the above-described embodiments or the like. Various changes, modifications, substitutions, additions, deletions, and combinations can be made within the scope of the claims. Of course, these also fall within the technical scope of the present disclosure.

This application claims priority based on Japanese Patent Application No. 2019-046325 filed with the Japan Patent Office on Mar. 13, 2019, and the entire disclosure of Japanese Patent Application No. 2019-046325 is incorporated herein in its entirety by reference.

EXPLANATION OF REFERENCE NUMERALS

10: substrate, 11: conductive film, 12: insulating film, 13: metal oxide film, 14: base substrate, 15: silicon oxide film, 20: intermediate film, 30: self-assembled monolayer (SAM), 40: target film, 100: film formation apparatus, 110: processing unit, 120: processing container, 130: substrate holder, 140: heater, 150: gas supplier, 160: gas discharger, 170: transfer device, 180: controller

What is claimed is:
1. A film formation method comprising:
providing a substrate including a first region in which a first material, which is a conductive material including a metal, or an oxide formed through a surface oxidation of the conductive material, is exposed and a second region in which a second material, which is an insulating material including silicon and is different from the first material is exposed;
forming a silicon oxide film exposed in the second region by surface-oxidizing the second region;

after the forming the silicon oxide film, forming an intermediate film, which is an ammonium fluorosilicate film, selectively in the second region from the first region and the second region by supplying a processing gas to the substrate;

forming a self-assembled monolayer in the first region and the second region after forming the intermediate film;

removing the intermediate film and the self-assembled monolayer from the second region by heating the substrate to sublimate the intermediate film; and forming, after sublimation of the intermediate film, a target film selectively in the second region from the first region and the second region in a state in which the self-assembled monolayer is left in the first region, wherein the processing gas used to form the intermediate film includes a hydrogen fluoride gas and an ammonia gas.

2. The film formation method of claim 1, wherein the target film is an insulating material including silicon, and the forming the intermediate film, the forming the self-assembled monolayer, sublimating the intermediate film, and the forming the target film are repeatedly performed.

3. A film formation method comprising:

providing a substrate including a first region in which a first material, which is a metal oxide formed through a surface oxidation of a conductive material including a metal, is exposed and a second region in which a second material, which is an insulating material including silicon and is different from the first material, is exposed;

removing the metal oxide formed through the surface oxidation such that the metal is exposed in the first region;

after the removing the metal oxide, forming an intermediate film, which is an ammonium fluorosilicate film, selectively in the second region from the first region and the second region by supplying a processing gas to the substrate;

forming a self-assembled monolayer in the first region and the second region after the forming the intermediate film;

removing the intermediate film and the self-assembled monolayer from the second region by heating the substrate to sublimate the intermediate film; and forming, after sublimation of the intermediate film, a target film selectively in the second region from the first region and the second region in a state in which the self-assembled monolayer is left in the first region, wherein the processing gas used to form the intermediate film includes a hydrogen fluoride gas and an ammonia gas.

4. The film formation method of claim 3, further comprising:

forming a silicon oxide film exposed in the second region by surface-oxidizing the second region before the forming the intermediate film, wherein the removing the metal oxide is performed after the forming the silicon oxide film and before the forming the intermediate film.

5. The film formation method of claim 3, wherein the target film is an insulating material including silicon, and the forming the intermediate film, the forming the self-assembled monolayer, sublimating the intermediate film, and the forming the target film are repeatedly performed.

* * * * *